United States Patent
Yun et al.

(10) Patent No.: US 7,037,768 B2
(45) Date of Patent: May 2, 2006

(54) METHODS OF ETCHING INTERMEDIATE SILICON GERMANIUM LAYERS USING ION IMPLANTATION TO PROMOTE SELECTIVITY

(75) Inventors: Eun-jung Yun, Seoul (KR);
Sung-young Lee, Gyeonggi-do (KR);
Chang-sub Lee, Gyeonggi-do (KR);
Sung-min Kim, Incheon-si (KR);
Dong-gun Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/884,749

(22) Filed: Jul. 2, 2004

(65) Prior Publication Data

US 2005/0003628 A1    Jan. 6, 2005

(30) Foreign Application Priority Data

Jul. 5, 2003   (KR) ...................... 10-2003-0045528

(51) Int. Cl.
*H01L 21/00*   (2006.01)
*H01L 21/84*   (2006.01)
*H01L 21/8238* (2006.01)
*H01L 21/76*   (2006.01)

(52) U.S. Cl. ...................... 438/149; 438/423; 438/207; 438/444

(58) Field of Classification Search ................ 438/423, 438/149, 207, 444, 218, 309, 377, 369, 447, 438/405, 443
See application file for complete search history.

(56) References Cited

U.S. PATENT DOCUMENTS

| | | | |
|---|---|---|---|
| 6,429,091 B1 | 8/2002 | Chen et al. | 438/423 |
| 2003/0137017 A1* | 7/2003 | Hisamoto et al. | 257/407 |

* cited by examiner

*Primary Examiner*—Chuong Anh Luu
(74) *Attorney, Agent, or Firm*—Myers Bigel Sibley & Sajovec, PA

(57) ABSTRACT

An integrated circuit device structure can be formed by forming an implant mask having a window therein on a structure including upper and lower Si layers and an intermediate $SiGe_x$ layer therebetween. Ions are implanted through the upper Si layer and into a portion of the intermediate $SiGe_x$ layer exposed through the window in the implant mask and blocking implantation of ions into portions of the intermediate $SiGe_x$ layer outside the window. The portions of the intermediate $SiGe_x$ layer outside the window are etched and the portion of the intermediate $SiGe_x$ layer exposed through the window having ions implanted therein is not substantially etched to form a patterned intermediate $SiGe_x$ layer.

20 Claims, 3 Drawing Sheets

METHODS OF ETCHING INTERMEDIATE SILICON GERMANIUM LAYERS USING ION IMPLANTATION TO PROMOTE SELECTIVITY

CROSS-REFERENCE TO RELATED APPLICATION

This application claims the priority of Korean Patent Application No. 2003-45528, filed on Jul. 5, 2003, in the Korean Intellectual Property Office, the disclosure of which is incorporated herein by reference in its entirety.

FIELD OF THE INVENTION

The invention relates to methods of forming integrated circuit devices, and more particularly, to methods of implanting ions to form integrated circuit devices.

BACKGROUND

It is known to form integrated circuit devices (i.e., semiconductors) including a $SiGe_x$ layer by, for example, patterning. In some conventional approaches, an intermediate $SiGe_x$ layer is formed between upper and lower layers and is selectively patterned using, for example, an etch mask through which an exposed portion of an integrated circuit substrate is etched. However, it may be difficult to selectively etch the intermediate $SiGe_x$ layer using only the etch mask. It is known to use lateral etching for predetermined times or to use additional processes to selectively etch the $SiGe_x$ layer. However, time based etching may be regarded as a very unpredictable approach.

Lateral etching applied to an intermediate layer is discussed, for example, in published U.S. patent application Ser. No. 6,429,091 B1, to Chen et al., entitled "Patterned Buried Insulator." In particular, Chen et al. discusses laterally removing a buried doping layer via anisotropic etching after forming the buried doping layer by ion implantation. The etching in Chen et al. is carried out on a P-type silicon substrate, and thus, it may be very difficult to etch only the $SiGe_x$ layer between the Si layers, as there may be patterning effects on the other layers as well.

SUMMARY

Embodiments according to the invention can provide methods of etching intermediate silicon germanium layers using ion implantation to promote selectivity. Pursuant to some of these embodiments according to the invention, an integrated circuit device structure can be formed by forming an implant mask having a window therein on a structure including upper and lower Si layers and an intermediate $SiGe_x$ layer therebetween. Ions are implanted through the upper Si layer and into a portion of the intermediate $SiGe_x$ layer exposed through the window in the implant mask and blocking implantation of ions into portions of the intermediate $SiGe_x$ layer outside the window. The portions of the intermediate $SiGe_x$ layer outside the window are etched and the portion of the intermediate $SiGe_x$ layer exposed through the window having ions implanted therein substantially avoids being etched to form a patterned intermediate $SiGe_x$ layer.

In some embodiments according to the invention, the etching further includes substantially avoiding etching of the upper and lower Si layers. In some embodiments according to the invention, the following is performed before etching the portions of the intermediate $SiGe_x$ layer outside the window: forming a trench in the upper Si layer and the intermediate $SiGe_x$ layer to expose a side surface of the intermediate $SiGe_x$ layer.

In some embodiments according to the invention, etching the portions of the intermediate $SiGe_x$ layer outside the window further includes laterally etching the exposed side surface of the intermediate $SiGe_x$ layer from the trench toward the portion of the intermediate $SiGe_x$ layer exposed through the window in the implant mask into which the ions are implanted.

In some embodiments according to the invention, the ions are phosphorous (P) ions. In some embodiments according to the invention, the P ions are implanted at a dose of at least about $5\times10^{12}/cm^2$. In some embodiments according to the invention, the P ions are implanted at a dose of at least about $1\times10^{13}/cm^2$. In some embodiments according to the invention, the etching includes wet etching using an etchant including $HNO_3$. In some embodiments according to the invention, the etchant further includes HF and/or $CH_3COOH$. In some embodiments according to the invention, the etchant is diluted by distilled water. In some embodiments according to the invention, the etchant includes $HNO_3$, HF, $CH_3COOH$, and $H_2O$ in a ratio of about 40:1:2:57, diluted by distilled water in a ratio of about 10:2.

DETAILED DESCRIPTION OF EMBODIMENTS ACCORDING TO THE INVENTION

Figure 1:
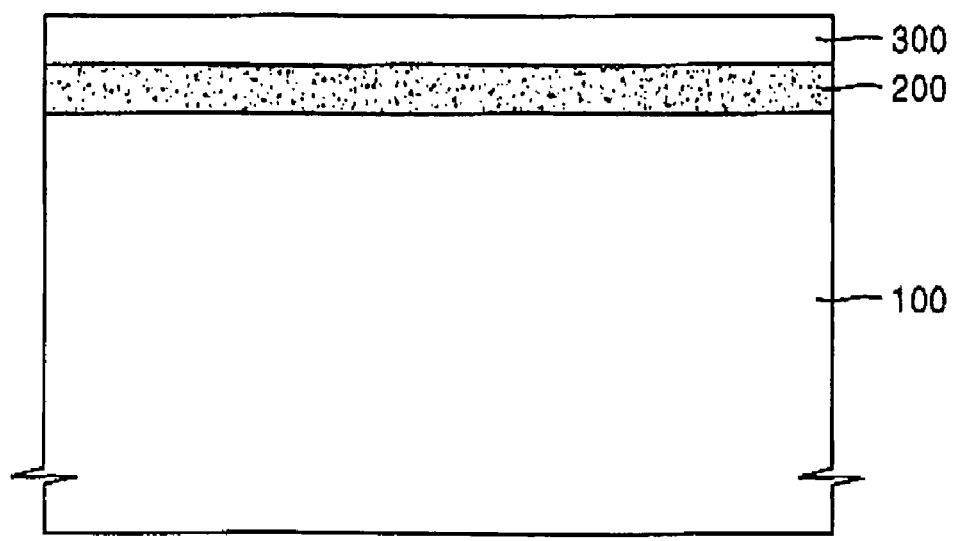
FIGS. 1 through 4 are cross-sectional views illustrating methods of selectively etching intermediate $SiGe_x$ layers using ion implantation according to some embodiments of the invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein. For example, as used herein, the term "avoiding etching" will be interpreted to mean substantially avoiding etching to the extent that, for example, an associated structure (or method) would be understood by those skilled in the art to accomplish "avoiding etching," rather than in the absolute sense. In contrast, the term "avoiding any etching" will be interpreted to mean that none of the associated material is etched.

In some embodiments according to the invention, an implant mask is formed on an intermediate $SiGe_x$ layer having a window that exposes a portion of the intermediate $SiGe_x$ layer. Ions are implanted through the window of the implant mask into the intermediate $SiGe_x$ layer, whereas ions are blocked from implantation into other portions of the intermediate $SiGe_x$ layer (e.g., below the implant mask). The implant mask can be removed and an etch can be performed that selectively removes the portions of the intermediate SiGe layer where the ion implantation was blocked and avoids etching the portion of the intermediate $SiGe_x$ layer into which the ions where implanted. A layer above the intermediate $SiGe_x$ layer can be left in place during the selective etching of the intermediate $SiGe_x$ layer, thereby reducing the need for an etching mask to, for example, protect the portion of the intermediate $SiGe_x$ layer having ions implanted therein.

In some embodiments according to the invention, various impurities may be implanted into the exposed portion on the intermediate $SiGe_x$ layer. In some embodiments according to the invention, the impurity can increase the conductivity of the portion of the intermediate $SiGe_x$ layer into which the impurities are implanted. For example, in some embodiments according to the invention, boron (B) or phosphorous (P) may be used as the implanted ion dopant. In some embodiments according to the invention, better results may be obtained by using a P type ion as the dopant.

In some embodiments according to the invention, the etch selectivity of the portion of the intermediate $SiGe_x$ layer into which ions are implanted may depend on the type of etching used. For example, in some embodiments according to the invention, wet etching is performed using $HNO_3$, which may selectively etch the portion of the intermediate $SiGe_x$ layer into which ions are not implanted, and is diluted by distilled water. The etchant may further include HF, $CH_3COOH$ and/or $H_2O$.

Some embodiments according to the invention can be used to form various integrated circuit devices. For example, embodiments according to the invention can be used to form a silicon on insulator (SOI) for a field effect transistor (FET) where a floating body effect may otherwise occur when utilized in high speed or high voltage devices.

Some embodiments according to the invention can be used to form a structure having lower and upper Si layers and an intermediate $SiGe_x$ layer therebetween. The etching can remove portions of the intermediate $SiGe_x$ layer where the ions are not implanted. In such embodiments according to the invention, a channel of a transistor and/or drain/source regions can be formed in the upper Si layer and a gate can be formed above the channel. At least a portion of the drain/source region is located above portions of the intermediate $SiGe_x$ layer which were selectively removed to provide a void therein. An insulating material can be formed in the void to insulate a lower portion of the drain/source region. A well is formed below the channel in the upper Si layer and is electrically connected to the lower Si layer via the portion of the intermediate $SiGe_x$ layer into which ions were implanted. Therefore, a floating body effect known to exist in SOI structures, may be reduced due to the electrical connection between the substrate and the intermediate $SiGe_x$ layer.

FIGS. 1 through 4 are cross-sections illustrating method embodiments of forming integrated circuit structures including an intermediate $SiGe_x$ layer having ions implanted therein according to the invention. Referring to FIG. 1, a lower Si layer 100, an intermediate $SiGe_x$ layer 200, and an upper Si layer 300 are sequentially formed. The lower Si layer 100 may be a silicon substrate or a layer formed by epitaxial growth. The intermediate $SiGe_x$ layer 200 may be formed by epitaxial growth on the lower Si layer 100 and the upper Si layer 300 may also be formed by epitaxial growth on the intermediate $SiGe_x$ layer 200.

Figure 2:
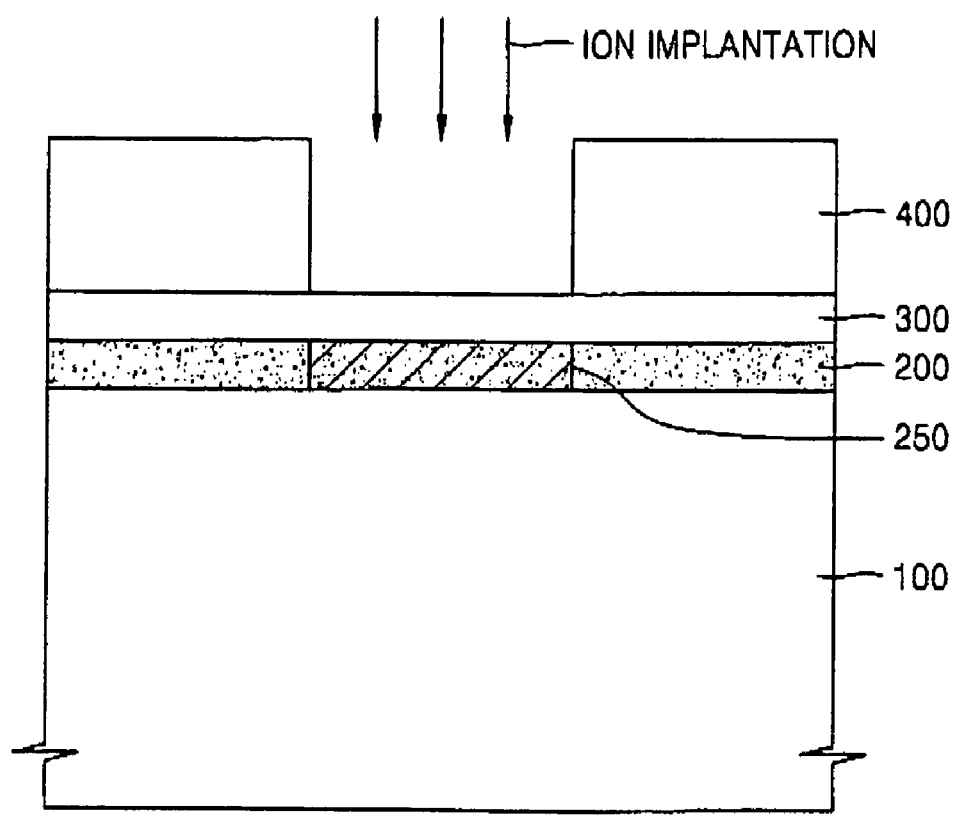

Referring to FIG. 2, an ion implant mask 400 is formed on the upper Si layer 300 having a window therein that exposes a portion of a surface of the upper Si layer 300 and an underlying portion 250 of the intermediate $SiGe_x$ layer 200. The ion implant mask 400 may be as a photoresist pattern. It will be understood that, although not illustrated, in some embodiments according to the invention, an ion implant pad layer may be form on the upper surface of the upper Si layer 300.

Ions are selectively implanted through the window in the implant mask 400 into the exposed portion of the upper Si layer 300 and into the underlying portion of the intermediate $SiGe_x$ layer 200. In some embodiments according to the invention, the ion implantation may be performed using an N- or P-type conductive dopant, such as, B or P. In some embodiments according to the invention, improved etch selectivity may be obtained using a P-type dopant. In some embodiments according to the invention, $P^+$ type ions are implanted at dosage of about at least $1 \times 10^{13}/cm^2$. In some embodiments according to the invention, a greater dosage can be used. It will be understood that a range of energy levels can be used for the implantation depending on the thickness of the upper Si layer 300 and to promote a distribution of $P^+$ ions that is substantially uniform in the intermediate $SiGe_x$ layer 200.

Figure 3:
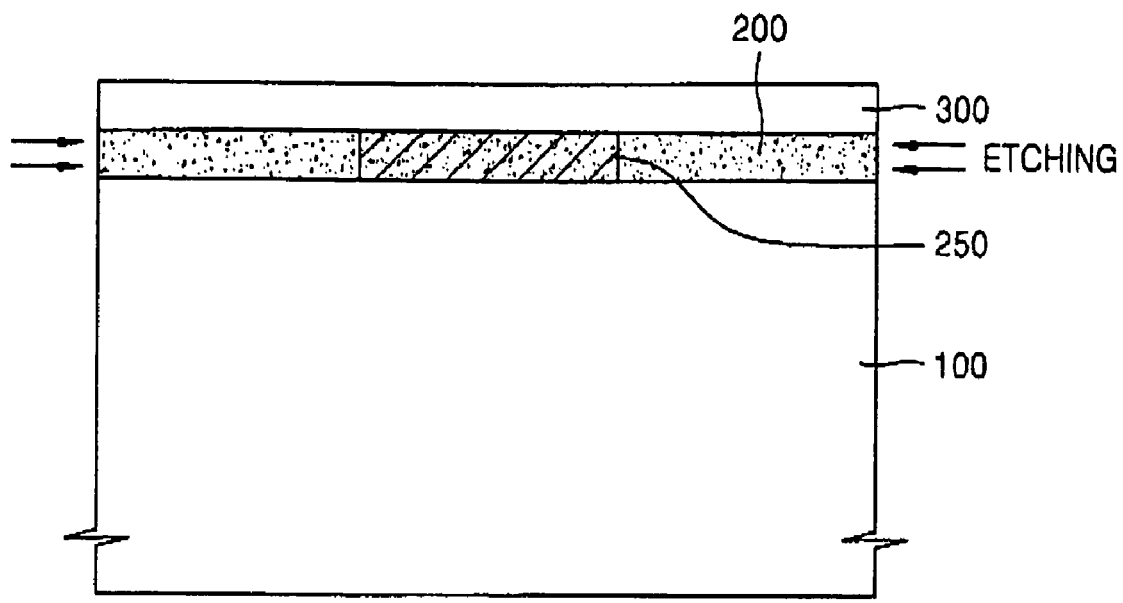

Referring to FIG. 3, a side surface of the intermediate $SiGe_x$ layer 200 is exposed and lateral etching is performed on the exposed side surface. The side surface of the intermediate $SiGe_x$ layer 200 may be exposed by selectively etching or patterning the upper Si layer 300. For example, in some embodiments according to the invention, the side surface of the intermediate $SiGe_x$ layer 200 is exposed by sequentially etching the upper Si layer 300, the intermediate $SiGe_x$ layer 200, and the lower Si layer 100 to form a trench (not shown) in the lower Si layer 100 for shallow trench isolation (STI).

In some embodiments according to the invention, the exposed side surface of the intermediate $SiGe_x$ layer 200 is laterally etched using anisotropic etching, and, in particular, by wet etching. The anisotropic or wet etching selectively etches the intermediate SiGeX layer relative to the upper and lower Si layers 300 and 100. For example, in some embodiments according to the invention, the upper and lower Si layers 300 and 100 are not etched whereas the intermediate $SiGe_x$ layer 200 is etched.

In some embodiments according to the invention, the etchant includes $HNO_3$, diluted by distilled water. In some embodiments according to the invention, the etchant may further include small quantities of HF and $CH_3COOH$. The etchant can include other components.

Figure 4:
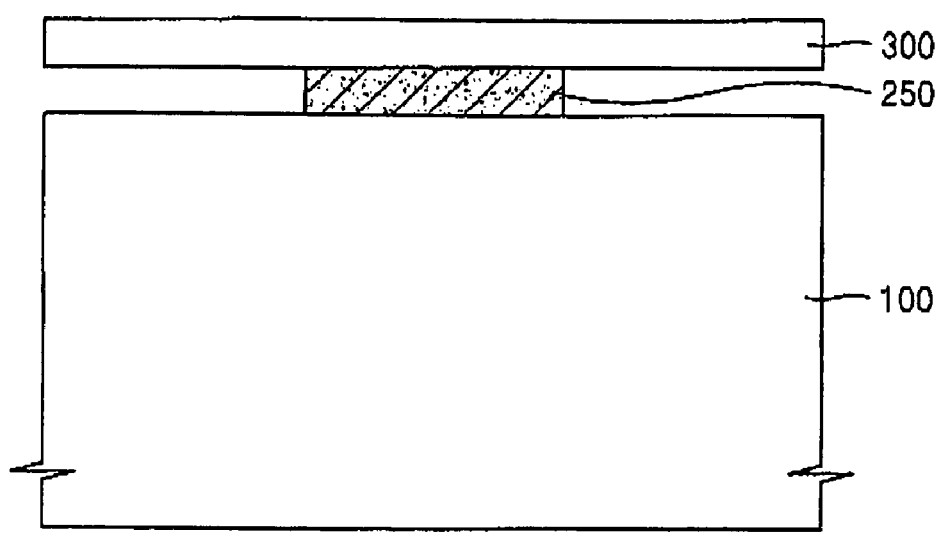

Referring to FIG. 4, etching of the intermediate SiGeX layer 200 stops at the ion-implanted portion 250 of the intermediate $SiGe_x$ layer 200 to form voids adjoining the ion-implanted portion 250. The portion 250 has an etch selectivity with respect to the intermediate $SiGe_x$ layer 200, and thus, the portion 250 is not etched during a process of etching the intermediate $SiGe_x$ layer 200. Therefore, as illustrated in FIG. 4, the portion 250, which has a smaller width than the upper and lower Si layers 300 and 100, is formed between the upper and lower Si layers 300 and 100.

As described above, this structure may reduce floating body effects in a FET device. In addition, this structure may be used in forming a fin-type FET device.

Figure 5A:
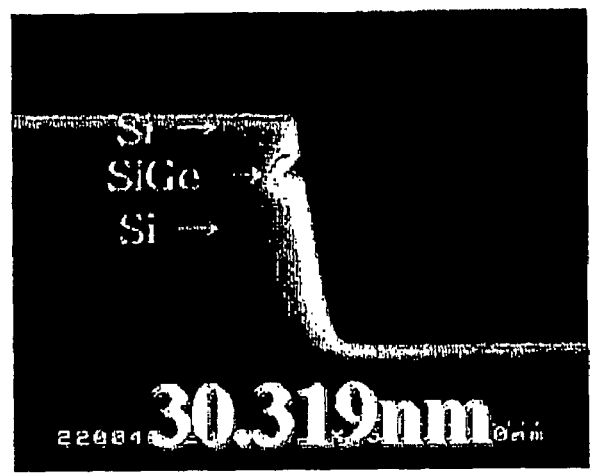
FIGS. 5A through 5C are scanning electron microscope (SEM) pictures of an exemplary intermediate $SiGe_x$ layers formed according to some embodiments of the invention.
Figure 5B:
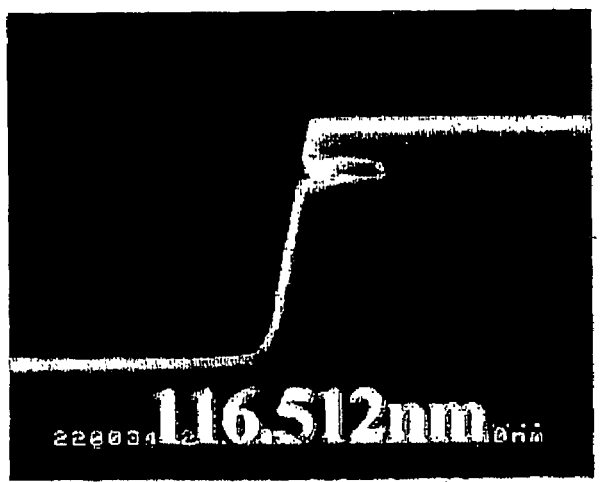
Figure 5C:
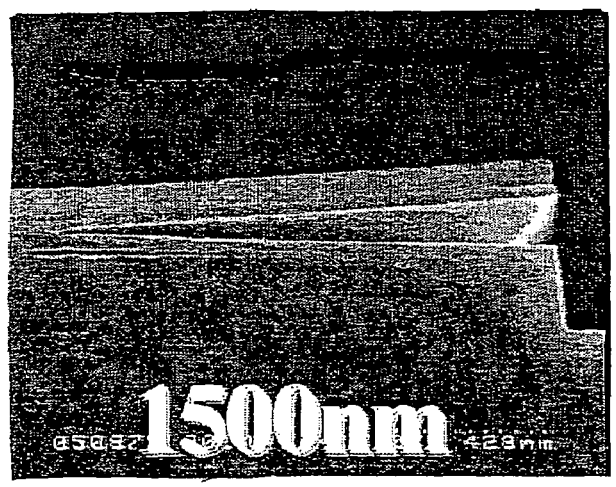

FIGS. 5A through 5C are scanning electron microscope (SEM) pictures of an exemplary $SiGe_x$ layer having an ion implantation according to some embodiments of the as described above, for example, with reference to FIGS. 1 through 4.

Referring to FIGS. 5A through 5C, a portion of the intermediate $SiGe_x$ layer having ions implanted therein remains between upper and lower Si layers after etching other portions of the intermediate $SiGe_x$ layer where the ions where not implanted. These samples were produced by implanting $P^+$ ions into the intermediate $SiGe_x$ layer to provide an etch selectivity to the portion of the intermediate $SiGe_x$ layer into which the ions where implanted.

FIG. 5A illustrates a case where $P^+$ ions were implanted into the intermediate $SiGe_x$ layer at a dose of about $1 \times 10^{13}/cm^2$ in a structure including a lower Si layer, an upper Si layer and an intermediate $SiGe_x$ layer therebetween. FIG. 5B illustrates a case where $P^+$ ions were implanted into the intermediate $SiGe_x$ layer at a dose of about $5 \times 10^{12}/cm^2$ and FIG. 5C illustrates a case where $P^+$ ions were not implanted into the intermediate $SiGe_x$ layer.

The structures illustrated in FIGS. 5A through 5C were formed by forming a trench in a structure having a lower Si layer, an upper Si layer and an intermediate $SiGe_x$ layer therebetween. A side surface of the intermediate $SiGe_x$ layer was exposed and a wet etch was performed thereon. The etchant included $HNO_3$, HF, $CH_3COOH$, and $H_2O$ in a ratio of 40:1:2:57, diluted by distilled water in a ratio of 10:2. It will be appreciated by those skilled in the art, when given the benefit of this disclosure, that the above ratios may be varied within the scope of the invention.

Referring to FIGS. 5A and 5B, it is found that the etch selectivity increased as the dose of $P^+$ ions increased. Referring to FIGS. 5B and 5C, it is found that the $P^+$ implanted intermediate $SiGe_x$ layer portion has an etch selectivity relative to the portions of the intermediate $SiGe_x$ layer that were shielded from the ion implantation. Accordingly, in some embodiments according to the invention, it is preferable that the $P^+$ ions are implanted with a dosage of at least $1 \times 10^{13}/cm^2$ to provide sufficient etch selectivity to the portion of the intermediate $SiGe_x$ layer into which the ions are implanted.

As described above, the portion of the intermediate $SiGe_x$ layer which is not ion-implanted is etched whereas the portion of the intermediate $SiGe_x$ layer into which the $P^+$ ions are implanted remains. Therefore, when an upper layer is formed on the intermediate $SiGe_x$ layer, the intermediate $SiGe_x$ layer is patterned, but the upper layer may not be patterned. This patterning method can, therefore, selectively pattern (and provide conductivity to) the intermediate $SiGe_x$ layer, which may reduce or eliminate floating body effects in FET devices so formed.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming an integrated circuit device structure comprising:
    forming an implant mask having a window therein on a structure including upper and lower Si layers and an intermediate $SiGe_x$ layer therebetween;
    implanting ions through the upper Si layer and into a portion of the intermediate $SiGe_x$ layer exposed through the window in the implant mask and blocking implantation of ions into portions of the intermediate $SiGe_x$ layer outside the window; and
    etching the portions of the intermediate $SiGe_x$ layer outside the window and avoiding substantially etching the portion of the intermediate $SiGe_x$ layer exposed through the window having ions implanted therein to form a patterned intermediate $SiGe_x$ layer.

2. A method according to claim 1 wherein etching further comprises substantially avoiding etching of the upper and lower Si layers.

3. A method according to claim 1 wherein the following is performed before etching the portions of the intermediate $SiGe_x$ layer outside the window:
forming a trench in the upper Si layer and the intermediate $SiGe_x$ layer to expose a side surface of the intermediate $SiGe_x$ layer.

4. A method according to claim 3 wherein etching the portions of the intermediate $SiGe_x$ layer outside the window further comprises:
laterally etching the exposed side surface of the intermediate $SiGe_x$ layer from the trench toward the portion of the intermediate $SiGe_x$ layer exposed through the window in the implant mask into which the ions are implanted.

5. A method according to claim 1 wherein the ions comprise phosphorous (P) ions.

6. A method according claim 5 wherein the P ions are implanted at a dose of at least about $5 \times 10^2/cm^2$.

7. A method according to claim 5 wherein the P ions are implanted at a dose of at least about $1 \times 10^3/cm^2$.

8. A method according to claim 1 wherein etching comprises wet etching using an etchant including $HNO_3$.

9. A method according to claim 8 wherein the etchant further includes HF and/or $CH_3COOH$.

10. A method according to claim 8 wherein the etchant is diluted by distilled water.

11. A method according to claim 8 wherein the etchant comprises $HNO_3$, HF, $CH_3COOH$, and $H_2O$ in a ratio of about 40:1:2:57, diluted by distilled water in a ratio of about 10:2.

12. A method of forming an integrated circuit device structure comprising:
forming an implant mask having a window therein on a structure including upper and lower Si layers and an intermediate $SiGe_x$ layer therebetween;
implanting ions through the upper Si layer and into a portion of the intermediate $SiGe_x$ layer exposed through the window in the implant mask and blocking implantation of ions into portions of the intermediate $SiGe_x$ layer outside the window;
removing the implant mask and refraining from forming an etching mask on the upper Si layer; and
etching the portions of the intermediate $SiGe_x$ layer outside the window and avoiding substantially etching the portion of the intermediate $SiGe_x$ layer exposed through the window having ions implanted therein to form a patterned intermediate $SiGe_x$ layer.

13. A method according to claim 12 wherein etching comprises etching using an etchant comprising $HNO_3$, HF, $CH_3COOH$, and $H_2O$ in a ratio of about 40:1:2:57, diluted by distilled water in a ratio of about 10:2.

14. A method according to claim 12 wherein the following is performed before etching the portions of the intermediate $SiGe_x$ layer outside the window:
forming a trench in the upper Si layer and the intermediate $SiGe_x$ layer to expose a side surface of the intermediate $SiGe_x$ layer.

15. A method according to claim 14 wherein etching the portions of the intermediate $SiGe_x$ layer outside the window further comprises:
laterally etching the exposed side surface of the intermediate $SiGe_x$ layer from the trench toward the portion of the intermediate $SiGe_x$ layer exposed through the window in the implant mask into which the ions are implanted.

16. A method of forming an integrated circuit device structure comprising:
forming a structure including upper and lower Si layers and an intermediate $SiGe_x$ layer therebetween;
forming an implant mask having a window therein on the structure;
implanting ions through the upper Si layer and into a portion of the intermediate $SiGe_x$ layer exposed through the window in the implant mask and blocking implantation of ions into portions of the intermediate $SiGe_x$ layer outside the window;
removing the implant mask and refraining from forming an etching mask on the upper Si layer;
forming a trench in the upper Si layer and the intermediate $SiGe_x$ layer to expose a side surface of the intermediate $SiGe_x$ layer;
laterally etching the exposed side surface of the intermediate $SiGe_x$ layer from the trench toward the portion of the intermediate $SiGe_x$ layer exposed through the window in the implant mask into which the ions are implanted; and
etching the portions of the intermediate $SiGe_x$ layer outside the window and avoiding substantially etching the portion of the intermediate $SiGe_x$ layer exposed through the window having ions implanted therein to form a patterned intermediate $SiGe_x$ layer.

17. A method according to claim 16 wherein etching comprises wet etching using an etchant including $HNO_3$.

18. A method according to claim 17 wherein the etchant further includes HF and/or $CH_3COOH$.

19. A method according to claim 17 wherein the etchant is diluted by distilled water.

20. A method according to claim 17 wherein the etchant comprises $HNO_3$, HF, $CH_3COOH$, and $H_2O$ in a ratio of about 40:1:2:57, diluted by distilled water in a ratio of about 10:2.

* * * * *